United States Patent
Ku et al.

(10) Patent No.: US 12,327,728 B2
(45) Date of Patent: Jun. 10, 2025

(54) METHOD FOR MANUFACTURING A PRE-MOLD SUBSTRATE

(71) Applicant: HAESUNG DS CO., LTD., Gyeongsangnam-do (KR)

(72) Inventors: Jong Hoe Ku, Gyeongsangnam-do (KR); In Seob Bae, Gyeongsangnam-do (KR); Kwang Jae Yoo, Gyeongsangnam-do (KR)

(73) Assignee: HAESUNG DS CO., LTD., Gyeongsangnam-Do (KR)

( * ) Notice: Subject to any disclaimer, the term of this patent is extended or adjusted under 35 U.S.C. 154(b) by 0 days.

(21) Appl. No.: 17/755,298

(22) PCT Filed: Dec. 1, 2021

(86) PCT No.: PCT/KR2021/018021
§ 371 (c)(1),
(2) Date: Apr. 26, 2022

(87) PCT Pub. No.: WO2023/101044
PCT Pub. Date: Jun. 8, 2023

(65) Prior Publication Data
US 2024/0170291 A1    May 23, 2024

(30) Foreign Application Priority Data

Nov. 30, 2021 (KR) .......... 10-2021-0169331

(51) Int. Cl.
*H01L 21/304* (2006.01)
*H01L 23/00* (2006.01)

(52) U.S. Cl.
CPC .......... *H01L 21/3043* (2013.01); *H01L 24/29* (2013.01); *H01L 2224/29021* (2013.01)

(58) Field of Classification Search
CPC ................. H01L 21/3043; H01L 24/29; H01L 2224/29021; H01L 21/4828; H01L 23/49548; H01L 23/498; H01L 23/49861; H01L 23/49558; H01L 24/48; H01L 2224/48247
See application file for complete search history.

(56) References Cited

U.S. PATENT DOCUMENTS 6,081,029 A * 6/2000 Yamaguchi ....... H01L 23/49548
257/E23.125
6,172,424 B1 * 1/2001 Kinouchi .............. H01L 21/565
257/730

(Continued)

FOREIGN PATENT DOCUMENTS

JP         2004063742 A  *  2/2004   ........ H01L 21/4846
JP         4172111 B2    * 10/2008

(Continued)

*Primary Examiner* — Jeffrey T Carley
*Assistant Examiner* — Jose K Abraham
(74) *Attorney, Agent, or Firm* — Perman & Green, LLP

(57) ABSTRACT

A method of manufacturing a pre-mold substrate includes preparing an electrically conductive substrate, forming a groove on one surface of the substrate, arranging a resin to cover one surface of the substrate and the groove, removing a portion of the resin so that at least a portion of one surface of the substrate protrudes higher than a surface of the resin covering the groove, and forming a circuit pattern on another surface of the substrate.

13 Claims, 6 Drawing Sheets

(56) References Cited

U.S. PATENT DOCUMENTS

| | | | |
|---|---|---|---|
| 6,208,020 B1* | 3/2001 | Minamio | H01L 23/3107 257/730 |
| 6,291,274 B1* | 9/2001 | Oida | H01L 21/566 438/126 |
| 7,608,930 B2* | 10/2009 | Kasuya | H01L 24/97 257/784 |
| 7,723,163 B2 | 5/2010 | Xu et al. | |
| 9,922,919 B2* | 3/2018 | Bang | H01L 21/4828 |
| 9,966,517 B2* | 5/2018 | Oda | H01L 21/56 |
| 2013/0181225 A1* | 7/2013 | Oka | H01L 25/50 438/113 |
| 2013/0299848 A1* | 11/2013 | Fuergut | H01L 23/49537 257/E27.012 |
| 2015/0194323 A1* | 7/2015 | Kang | H01L 23/49827 216/14 |
| 2017/0271249 A1* | 9/2017 | Kasuya | H01L 23/3121 |
| 2019/0057930 A1* | 2/2019 | Bae | H01L 23/49861 |
| 2020/0168521 A1* | 5/2020 | Bae | H01L 23/142 |
| 2021/0106156 A1* | 4/2021 | Bang | A47G 9/0253 |
| 2021/0217629 A1 | 7/2021 | Yoon et al. | |

FOREIGN PATENT DOCUMENTS

| | | | |
|---|---|---|---|
| JP | 4266429 B2 * | 5/2009 | |
| JP | 2017069342 A * | 4/2017 | |
| JP | 6322853 B2 * | 5/2018 | |
| JP | 6537141 B2 * | 7/2019 | |
| JP | 2021150638 | 9/2021 | |
| JP | 2021150638 A * | 9/2021 | |
| KR | 20100039711 A * | 4/2010 | |
| KR | 20110021407 | 3/2011 | |
| KR | 20110116849 | 10/2011 | |
| KR | 20150081145 A * | 7/2015 | |
| KR | 101683825 B1 * | 12/2016 | |
| KR | 1602268 B * | 10/2017 | |
| KR | 1020210092073 | 7/2021 | |

* cited by examiner

METHOD FOR MANUFACTURING A PRE-MOLD SUBSTRATE

CROSS-REFERENCE TO RELATED APPLICATIONS

This application is National Stage of International Application No. PCT/KR2021/018021, having an International Filing Date of 1 Dec. 2021, which claims priority from and the benefit of Korean Patent Application No. 10-2021-0169331, filed on 30 Nov. 2021, the disclosures of which are incorporated herein by reference in their entireties.

TECHNICAL FIELD

Embodiments relate to a pre-mold substrate and a method of manufacturing the pre-mold substrate, and more particularly, to a method of manufacturing a pre-mold substrate having high reliability.

BACKGROUND ART

A circuit board is, for example, a component essential to an electronic component such as a semiconductor package, and a circuit board manufacturing technology having a high level of reliability suitable for the electronic circuit characteristics and operating environment of a product in which the circuit board is used is required.

Among circuit boards or lead frames, there is a pre-mold type substrate or pre-mold type lead frame on which a portion of a mold resin is arranged. The pre-mold type substrate or the pre-mold type lead frame has the advantage of shortening a semiconductor package manufacturing process because a portion of the mold resin is arranged in advance before the mounting of a semiconductor chip.

For example, U.S. Pat. No. 7,723,163 discloses a method of manufacturing a pre-molded lead frame.

(Patent Document 1) U.S. Pat. No. 7,723,163 (May 25, 2010)

DESCRIPTION OF EMBODIMENTS

Technical Problem

Embodiments provide a pre-mold substrate and a method of manufacturing the pre-mold substrate, which can improve reliability and reduce manufacturing cost.

Solution to Problem

A pre-mold substrate according to an embodiment includes an electrically conductive substrate having one surface and another surface, the electrically conductive substrate including a groove formed on the one surface and a circuit pattern formed on the other surface, and a resin arranged in the groove, wherein at least a portion of one surface of the substrate protrudes higher than a surface of the resin.

The circuit pattern may include a mounting portion on which a semiconductor chip is mountable, and a land located outside the mounting portion and electrically connected to the semiconductor chip by wire.

A method of manufacturing a pre-mold substrate according to an embodiment includes preparing an electrically conductive substrate, forming a groove on one surface of the substrate, arranging a resin to cover one surface of the substrate and the groove, removing a portion of the resin so that at least a portion of one surface of the substrate protrudes higher than a surface of the resin covering the groove, and forming a circuit pattern on another surface of the substrate.

The forming of the groove may include removing a portion of one surface of the substrate.

The forming of the groove may include removing a portion of one surface of the substrate by a half-etching method.

The forming of the groove may include arranging a photosensitive resist on one surface of the substrate, exposing and developing a groove pattern mask corresponding to the groove to face one surface of the substrate, and removing a portion of one surface of the substrate by applying an etchant to the one surface of the substrate.

A thickness of a grooved portion of the substrate by the forming of the groove may be 35 μm or more.

The method of manufacturing the pre-mold substrate may further include, between the forming of the groove and the arranging of the resin, a surface treatment operation of roughening one surface of the substrate.

The method of manufacturing the pre-mold substrate may further include curing the resin between the arranging of the resin and the removing of a portion of the resin.

In the arranging of the resin, the resin may be arranged to cover the entire area of one surface of the substrate and the groove.

The removing of a portion of the resin may include first removing the resin from the entire area of the substrate so that one surface of the substrate is exposed and secondly removing the resin covering the groove after the one surface of the substrate is exposed.

In the removing of a portion of the resin, the resin may be removed using a laser beam or a polishing brush.

A height at which at least a portion of one surface of the substrate protrudes higher than a surface of the resin by the removing of a portion of the resin may be 0.01 mm to 0.03 mm.

The forming of the circuit pattern may include arranging a photosensitive resist on another surface of the substrate, exposing and developing a pattern mask corresponding to the circuit pattern facing the other surface of the substrate, and removing a portion of the other surface of the substrate by applying an etchant to the other surface of the substrate.

The forming of the circuit pattern may further include forming a protective layer covering one surface of the substrate before applying the etchant to the other surface of the substrate and removing the protective layer after applying the etchant to the other surface of the substrate.

The method of manufacturing the pre-mold substrate may further include forming a plating layer on at least one surface of one surface of the substrate and one surface of the circuit pattern on another surface of the substrate.

Advantageous Effects of Disclosure

According to a pre-mold substrate and a method of manufacturing the pre-mold substrate according to the above-described embodiments, the substrate is stably supported by a resin arranged in a groove on one surface. Accordingly, the overall structure of the pre-mold substrate may be stably maintained during a semiconductor assembly process.

In addition, because a land of a circuit pattern of the substrate may be located adjacent to a mounting portion, a length of a conductive wire may be set short during a wire bonding process between a semiconductor chip and the land of the substrate. Accordingly, manufacturing cost and manufacturing time of the semiconductor package may be reduced.

In addition, because a mounting end of one surface of the substrate is formed to protrude higher than an end surface of a resin, when the pre-mold substrate is mounted on a printed circuit board, an area to which a solder is applied for a soldering process may be expanded, so that the reliability of a mounting structure of the pre-mold substrate may be improved.

BEST MODE

The disclosure will be clear with reference to the accompanying drawings, in which embodiments of the disclosure are shown. The disclosure may, however, be embodied in many different forms and should not be construed as being limited to the embodiments set forth herein; rather, these embodiments are provided so that this disclosure will be thorough and complete, and will fully convey the inventive concept to one of ordinary skill in the art, and the disclosure is only defined by the scope of claims. The terminology used herein is used only to describe specific embodiments and does not have any intention to limit the disclosure. An expression in the singular includes an expression in the plural unless the context clearly dictates otherwise. The terms "comprises" and/or "comprising," when used in this specification, specify the presence of stated components, steps, operations, and/or elements, but do not preclude the presence or addition of one or more other components, steps, operations, and/or elements. It will be understood that, although the terms first, second, etc. may be used herein to describe various elements, these elements should not be limited by these terms. These terms are used only to differentiate an element from another element.

Figure 1:
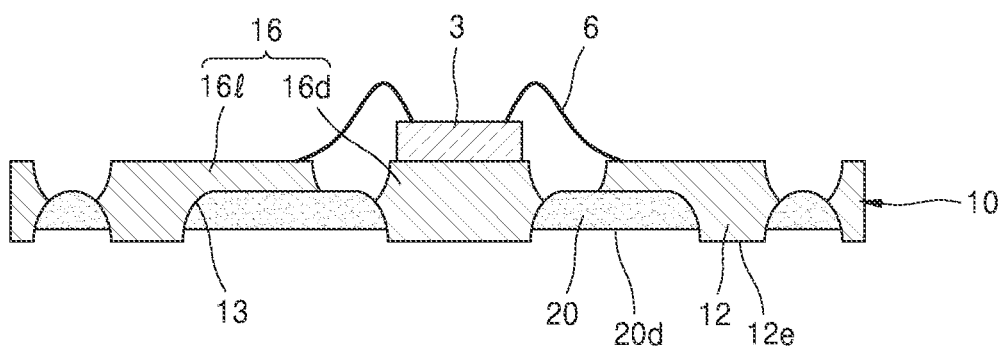
FIG. 1 is a cross-sectional view of a pre-mold substrate according to an embodiment.

FIG. 1 is a cross-sectional view of a pre-mold substrate according to an embodiment.

The pre-mold substrate according to the embodiment shown in FIG. 1 includes an electrically conductive substrate 10 and a resin 20 arranged in a groove 13 of the substrate 10.

The substrate 10 may include an electrically conductive metal material. The substrate 10 may be made of, for example, a single material such as Cu or Fe, and may be made of various materials such as copper alloys such as Cu—Sn, Cu—Zr, Cu—Fe, and Cu—Zn, and iron alloys such as Fe—Ni and Fe—Ni—Co. In addition, a commercially available lead frame material may be applied as a material of the substrate 10.

The substrate 10 includes the groove 13 formed on one surface and a circuit pattern 16 formed on the other surface. The groove 13 may be referred to as a pre-mold groove.

The resin 20 may be arranged in the groove 13 of the substrate 10. The resin 20 forms a pre-mold substrate together with the substrate 10. The resin 20 may protect the substrate 10.

The resin 20 is an electrically insulating material. The resin 20 may include a thermoplastic resin or a thermosetting resin, and may include silica in an amount of 80% to 90% or more by weight in order to minimize thermal expansion. In addition, the resin 20 may function to prevent solder cream from spreading on one surface of the substrate 10.

A surface 12e of a mounting end 12 of at least a portion of one surface of the substrate 10 may protrude higher than an end surface 20d of the resin 20.

According to the pre-mold substrate having the above-described configuration, the substrate 10 is stably supported by the resin 20 arranged in the groove 13 on one surface. Accordingly, the overall structure of the pre-mold substrate may be stably maintained during a semiconductor assembly process.

In addition, the mounting end 12 of one surface of the substrate 10 is formed to protrude higher than the end face 20d of the resin 20, so that the mounting end 12 may be utilized as a mounting conductive land for electrical connection. Solder for a soldering process may be applied to the surface 12e of the mounting end 12 of one surface of the substrate 10. According to such a pre-mold substrate, when the pre-mold substrate is mounted on a printed circuit board (PCB), an area to which solder is applied for a soldering process may be expanded, so that the reliability of a mounting structure of the pre-mold substrate may be improved.

In addition, the circuit pattern 16 formed on the other surface of the substrate 10 includes a land 16ℓ located outside a mounting portion 16d on which a semiconductor chip 3 is mountable. The land 16ℓ may be electrically connected to the semiconductor chip 3 by a conductive wire 6. Because the land 16ℓ may be located close to the mounting portion 16d, a length of the conductive wire 6 may be set short during a wire bonding process of the land 16ℓ of the semiconductor chip 3 and the substrate 10. This may reduce manufacturing cost and manufacturing time.

Figure 11:
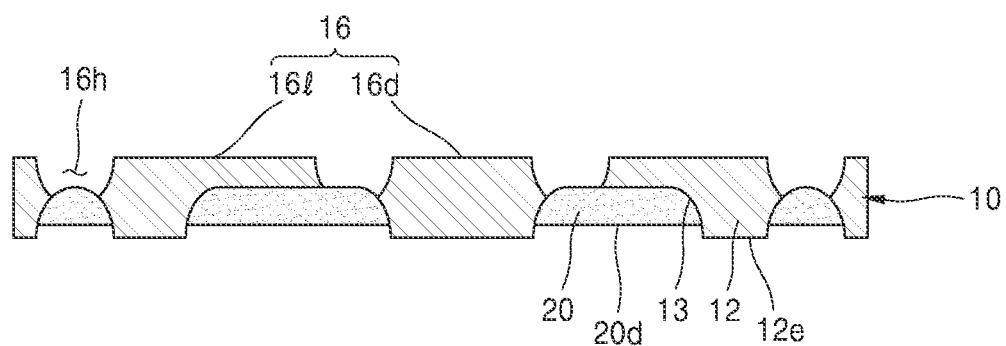
Figure 12:
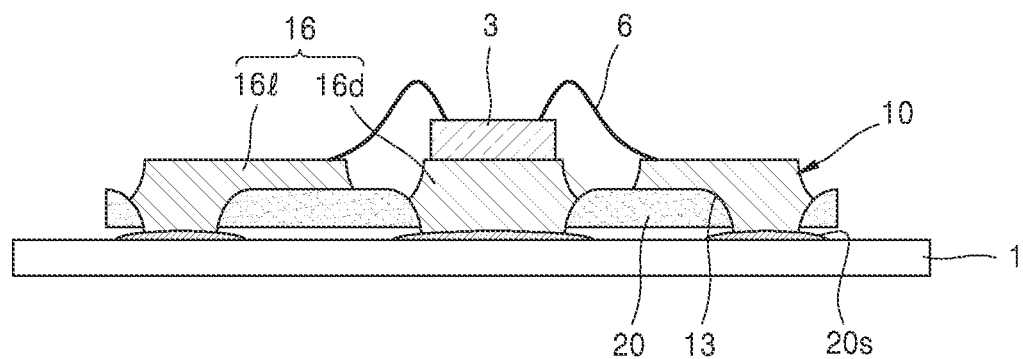
Figure 13:
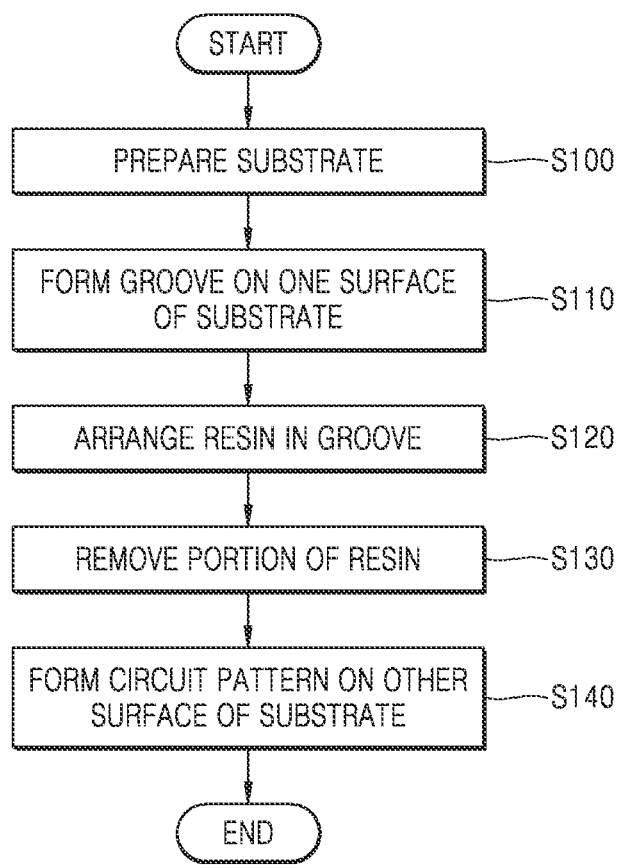
FIG. 13 is a flowchart schematically illustrating operations of a method of manufacturing a pre-mold substrate, according to an embodiment.

FIGS. 2 to 12 are cross-sectional views illustrating operations of a method of manufacturing a pre-mold substrate according to an embodiment, and FIG. 13 is a flowchart schematically illustrating operations of a method of manufacturing a pre-mold substrate according to an embodiment.

The method of manufacturing the pre-mold substrate according to the embodiments shown in FIGS. 2 to 13 includes operation S100 of preparing an electrically conductive substrate, operation S110 of forming a groove on one surface of the substrate, operation S120 of arranging a resin to cover the one surface and the groove of the substrate, operation S130 of removing a portion of the resin from the one surface of the substrate, and operation S140 of forming a circuit pattern on the other surface of the substrate.

Operation S130 of removing a portion of the resin from the one surface of the substrate, and operation S140 of forming a circuit pattern on the other surface of the substrate do not necessarily have to be performed in the order shown in FIG. 13, For example, operation S140 of forming a circuit pattern on the other surface of the substrate may be performed first, and thereafter, operation S130 of removing a portion of the resin from the one surface of the substrate may be performed.

According to the manufacturing method of the pre-mold substrate according to the embodiments shown in FIGS. 2 to 13, a lead frame for a semiconductor package may be manufactured using an electrically conductive substrate. Hereinafter, a 'lead frame' is an example of a circuit board manufactured by the method of manufacturing the pre-mold substrate according to the embodiments, wherein a lower surface of the lead frame corresponds to one surface of the circuit board, and an upper surface of the lead frame corresponds to the other surface of the circuit board.

MODE OF DISCLOSURE

Figure 2:
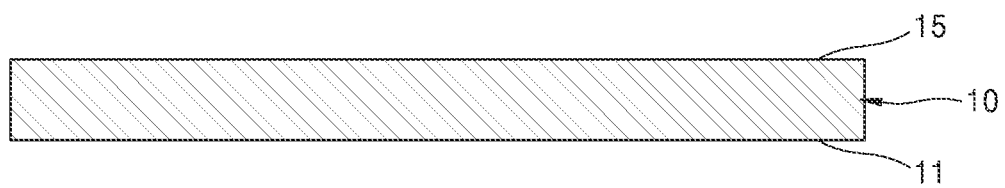
FIGS. 2 to 12 are cross-sectional views illustrating operations of a method of manufacturing a pre-mold substrate, according to an embodiment.

As shown in FIG. 2, preparing the substrate 10 made of an electrically conductive metal, for example, a material including copper (Cu) or a copper alloy is performed. In FIG. 2, a lower surface of the substrate 10 is one surface 11 and an upper surface is the other surface 15. For example, the substrate 10 may be in the form of a rigid base film for a circuit board or a thin flexible base film for a flexible printed circuit board (FPCB).

Figure 3:
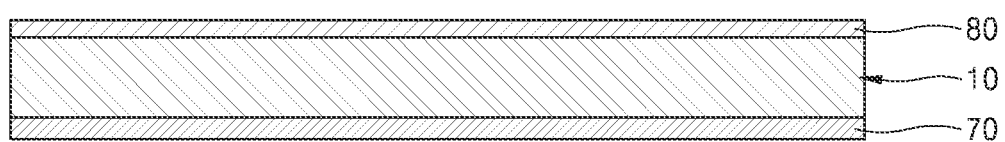

Referring to FIG. 3, after preparing the substrate 10, resist layers 70 and 80 are arranged on the one surface and the other surface of the substrate 10, respectively. The resist layers 70 and 80 may be, for example, a photosensitive resist (photoresist) that reacts to light.

Figure 4:
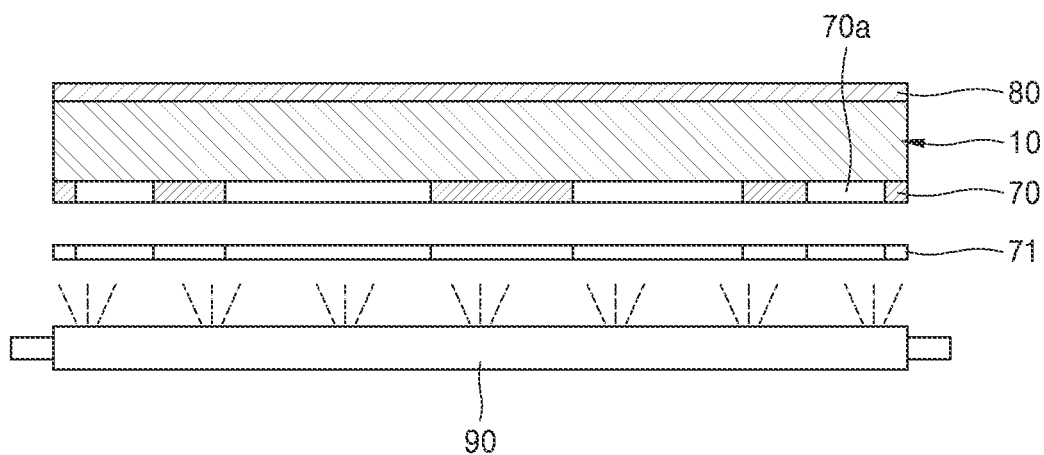

Referring to FIG. 4, a groove pattern mask 71 having a pattern of grooves to be formed on one surface of the substrate 10 is arranged to face the resist layer 70 arranged on the one surface of the substrate 10. In addition, by performing an exposure process of irradiating light to the resist layer 70 on the one surface of the substrate 10 through the groove pattern mask 71 using a light source 90, an exposed area 70a is formed on the resist layer 70.

After the exposure process, a developing process may be performed in which only a portion of the resist layer 70 is left by removing the exposed area 70a by contacting a developer to the resist layer 70 having the exposed area 70a formed through the exposure process.

The arranging of the resist layer 70, the exposure process, and the developing process as described above may be part of forming a groove on one surface of the substrate 10.

The embodiments are not limited by a positive photosensitive method shown in FIG. 4, and a negative method in which a portion of a resist layer exposed to light is removed may be used.

Figure 5:
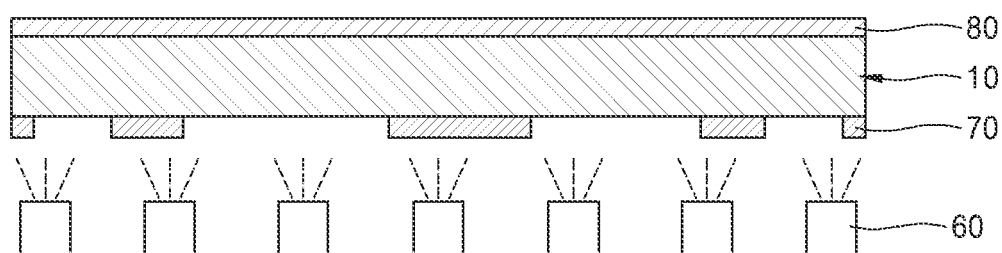

Referring to FIG. 5, removing a portion of one surface of the substrate 10 is performed. The removing of a portion of one surface of the substrate 10 may be a portion of forming a groove on the one surface of the substrate 10.

The removing of a portion of one surface of the substrate 10 may include removing a portion of one surface of the substrate 10 exposed to the outside by removing a portion of the resist layer 70 by a half-etching method. As the half-etching method, a spray injection method in which a copper chloride etchant containing copper (Cu) or a copper alloy material is sprayed onto one surface of the substrate 10 by a nozzle 60 may be used.

Figure 6:
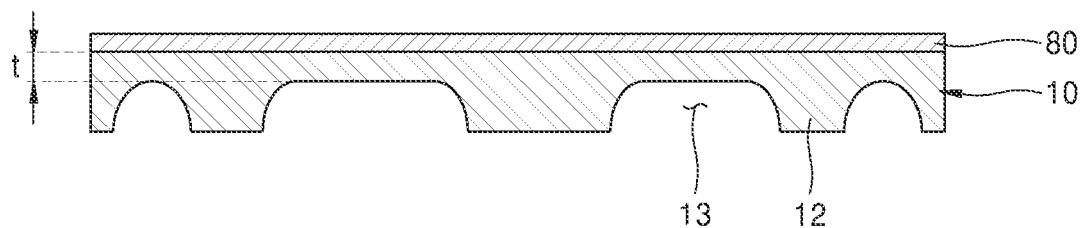

FIG. 6 shows the substrate 10 in which a plurality of grooves 13 are formed on one surface by removing a portion of one surface of the substrate 10 by a half-etching method. The mounting end 12 exposed to the outside from the outside of the groove 13 on one surface of the substrate 10 has the same material as that of the substrate 10, and thus may include Cu or a Cu alloy material.

In the removing of a portion of one surface of the substrate 10 to form the groove 13 on one surface of the substrate 10, in order to prevent deformation and wrinkling of the substrate 10, a thickness t of a portion in which the groove 13 is formed of the substrate 10 (i.e., the remaining portion of the substrate 10 at a position where the groove 13 is formed) may be formed to be 35 μm or more.

Figure 7:
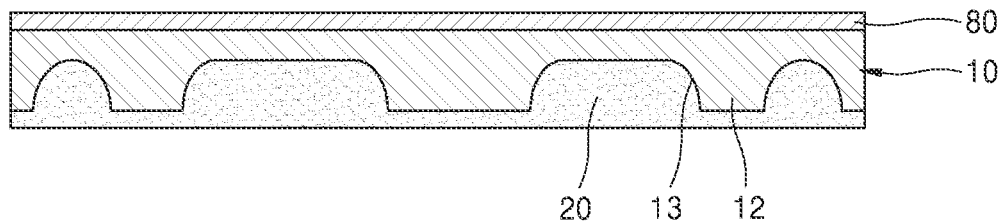

Referring to FIG. 7, after the forming of a groove on one surface of the substrate 10, arranging the resin 20 on one surface of the substrate 10 to cover the entire area of the one surface of the substrate 10 and the groove 13 is performed.

The resin 20 may include a material having no electrical conductivity, for example, an insulating resin. As an insulating resin arranged on one surface of the substrate 10, a liquid resin or a solid tape containing a resin component, powder containing a resin component, or the like may be used. After arranging the resin 20 on one surface of the substrate 10, curing the resin 20 may be performed.

A surface treatment operation of roughening one surface of the substrate 10 may be performed between the removing of a portion of one surface of the substrate 10 shown in FIG. 6 and the arranging of the resin 20 shown in FIG. 7.

The surface treatment operation is roughening surfaces of the mounting end 12 of one surface of the substrate 10 and the groove 13 between mounting ends 12 to improve the adhesion performance between the resin 20 and one surface of the substrate 10. The surface treatment operation may be forming fine protrusions on one surface of the substrate 10 and the groove 13 by plating, or forming minute concave grooves on one surface of the substrate 10 and the groove 13 by an etching process or a mechanical polishing process.

Figure 8:
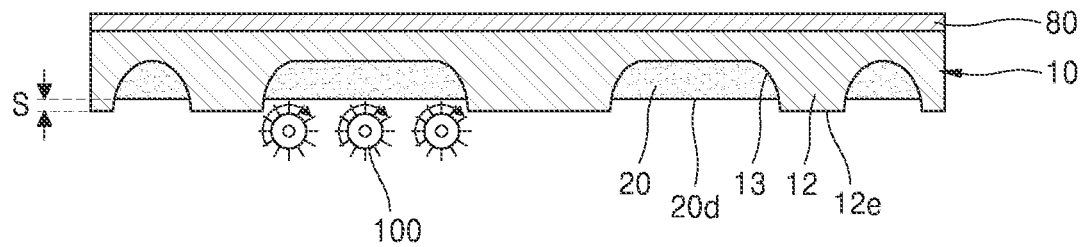

Referring to FIG. 8, after arranging the resin 20 on one surface of the substrate 10, removing a portion of an exposed surface of the resin 20 may be performed. The removing of a portion of the exposed surface of the resin 20 may include primarily removing a portion of the resin 20 from the entire area of one surface of the substrate 10 to expose the surface 12e of the mounting end 12 and secondly removing the resin 20 covering the groove 13 after the surface 12e of the mounting end 12 is exposed.

The removing of a portion of the exposed surface of the resin 20 may be performed by irradiating a laser beam on the surface of the resin 20 or polishing the surface of the resin 20 using a polishing brush 100.

For example, when removing a portion of the surface of the resin 20 using a laser, there is no effect on an electrically conductive substrate 10. As a wavelength band for removing only the resin 20, a laser having a wavelength of an ultraviolet wavelength band to an infrared wavelength band may be used.

For example, when removing a portion of the surface of the resin 20 using the polishing brush 100, a bristle brush having a particle size in the range of 100 to 1000 may be used.

After the secondly removing of the resin 20, flattening the end surface 20d of the resin 20 exposed to the outside may be performed.

When the removing of a portion of the resin 20 is completed, the surface 12e of the mounting end 12 of at least a portion of one surface of the substrate 10 may protrude higher than the end surface 20d of the resin 20. A height s at which the surface 12e of the mounting end 12 protrudes higher than the end surface 20d of the resin 20 may be 0.01 mm to 0.03 mm.

Because the surface 12e of the mounting end 12 of the substrate 10 protrudes higher than the end face 20d of the resin 20, the mounting end 12 will be utilized as a mounting conductive land for electrical connection. Solder for a soldering process may be applied to the surface 12e of the mounting end 12 of one surface of the substrate 10. According to such a pre-mold substrate, when the pre-mold substrate is mounted on a PCB, an area to which solder is applied for a soldering process may be expanded, so that the reliability of a mounting structure of the pre-mold substrate may be improved.

Figure 9:
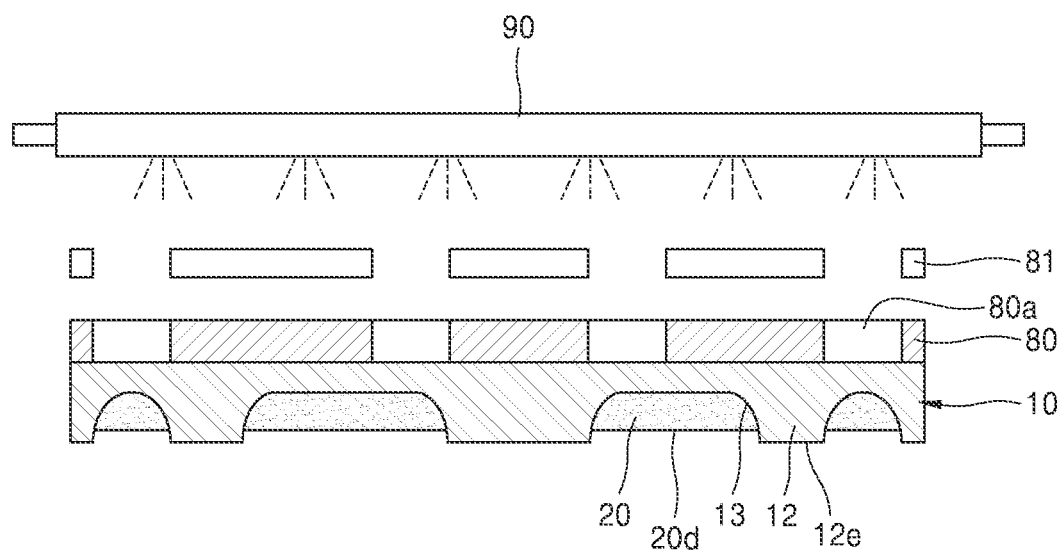

Referring to FIG. 9, forming a circuit pattern on the other surface of the substrate 10 may include arranging a pattern mask 81 to correspond to a resist layer 80 arranged on the other surface of the substrate 10, and forming an exposed area 80a in a resist layer 80 by performing an exposure process of irradiating light to the resist layer 80 on the other surface of the substrate 10 through the pattern mask 81 using the light source 90.

In addition, the forming of the circuit pattern on the other surface of the substrate 10 may include leaving only a portion of the resist layer 80 by performing a developing process of removing the exposed area 80a by contacting a developer with the resist layer 80 having the exposed area 80a formed through the exposure process.

The embodiments are not limited by a positive photosensitive method shown in FIG. 9, and a negative method in which a portion of a resist layer exposed to light is removed may be used.

Figure 10:
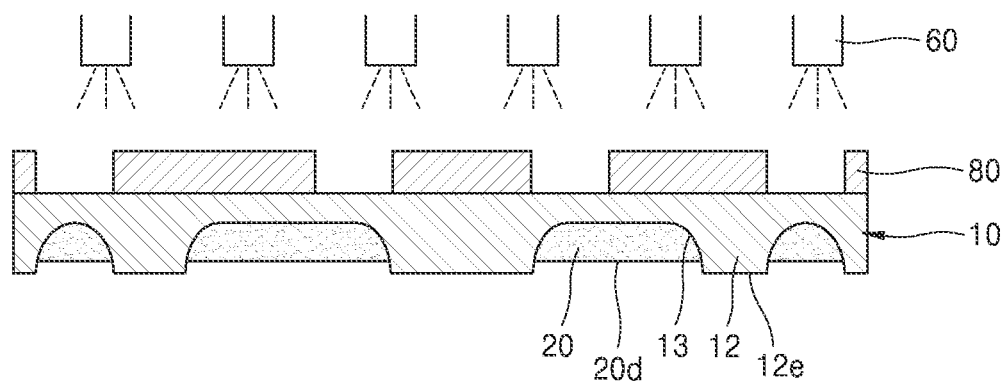

Referring to FIG. 10, as part of forming a circuit pattern on the other surface of the substrate 10, removing a portion of the other surface of the substrate 10 is performed. In the removing of a portion of the other surface of the substrate 10, a portion of the other surface of the substrate 10 exposed to the outside by removing a portion of the resist layer 80 may be removed by a half-etching method. As the half-etching method, a spray injection method in which a copper chloride etchant containing Cu or a Cu alloy material is sprayed onto the other surface of the substrate 10 by the nozzle 60 may be used.

Forming a protective layer covering one surface of the substrate 10 may be performed before the copper chloride etchant is sprayed on the other surface of the substrate 10. After the copper chloride etchant is sprayed on the other surface of the substrate 10, the protective layer may be removed from one surface of the substrate 10 may be performed.

FIG. 11 shows the substrate 10 having the circuit pattern 16 formed on the other surface by removing a portion of the other surface of the substrate 10 by a half-etching method to form a space 16h in the other surface. The space 16h of the other surface of the substrate 10 meets the groove 13 of one surface of the substrate 10 in a partial area of the substrate 10 to form a hole penetrating the substrate 10, thereby completing the circuit pattern 16.

After forming the circuit pattern 16 on the other surface of the substrate 10, a plating layer may be formed on at least one surface of circuit patterns on one surface and the other surface of the substrate 10.

Plating layers of different materials may be formed on one surface and the other surface of the substrate 10. In order to form a plating layer of a different material on one surface and the other surface of the substrate 10, for example, an insulating layer may be temporarily arranged on the other surface of the substrate 10 while a plating layer is formed on one surface of the substrate 10, and may be temporarily arranged on one surface of the substrate 10 while a plating layer is formed on the other surface of the substrate 10.

In order to form a plating layer on one surface of the substrate 10, for example, an electrolytic plating method may be used. That is, by applying a current to the substrate 10, a plating layer including at least one material selected from the group consisting of nickel, a nickel alloy, palladium, a palladium alloy, and a gold alloy may be formed on one surface of the substrate 10.

Because the plating layer of one surface of the substrate 10 includes at least one material selected from the group consisting of nickel, a nickel alloy, palladium, a palladium alloy, and a gold alloy, when a semiconductor assembly process is performed using the substrate 10, an electrical connection structure between one surface of the substrate 10 and other electronic components may be firmly completed.

In order to form a plating layer on the circuit pattern 16 of the other surface of the substrate 10, for example, an electrolytic plating method may be used. That is, by applying a current to the substrate 10, a plating layer including silver (Ag) or a silver alloy material may be plated on the circuit pattern 16.

Because a plating layer of the circuit pattern 16 of the other surface of the substrate 10 contains silver or a silver alloy, when the semiconductor chip 3 is arranged on the mounting portion 16d of the substrate 10 to electrically connect the substrate 10 and the semiconductor chip 3, improved soldering bonding performance may be realized. Because the soldering bonding performance between the conductive wire 6 and the circuit pattern 16 is excellent, mechanical robustness and electrical stability may be secured, thereby improving the overall reliability of the semiconductor package.

FIG. 12 shows an example of a semiconductor assembly process of assembling a semiconductor package including a pre-mold substrate completed by the operations of FIGS. 2 to 11, to a printed circuit board 1.

The semiconductor package is completed, after placing the semiconductor chip 3 on the mounting portion 16d of the other surface of the substrate 10, by electrically connecting the semiconductor chip 3 and the land 16t of the circuit pattern 16 on the other surface of the substrate 10 with the conductive wire 6. The semiconductor package may include a molding portion sealing the semiconductor chip 3. During an assembly process of the semiconductor package, a process of cutting an outer edge of the substrate 10 may be performed.

Because the land 16t used to electrically connect the semiconductor chip 3 and the substrate 10 with the conductive wire 6 may be located close to the mounting portion 16d, a length of the conductive wire 6 may be set short during a wire bonding process of the semiconductor chip 3 and the land 16t of the substrate 10. Accordingly, manufacturing cost and manufacturing time of the semiconductor package may be reduced.

In addition, the mounting end 12 of one surface of the substrate 10 is formed to protrude higher than the end face 20d of the resin 20, so that the mounting end 12 may be utilized as a mounting conductive land for electrical connection. Solder 20s for a soldering process may be applied to the surface 12e of the mounting end 12 of one surface of the substrate 10. According to such a pre-mold substrate, when the pre-mold substrate is mounted on the printed circuit board 1, an area to which solder is applied for a soldering process may be expanded, so that the reliability of a mounting structure of the pre-mold substrate may be improved.

The descriptions of configuration and effect of the above-described embodiments are merely examples, and it will be understood by one of ordinary skill in the art that various changes and equivalents thereof may be made. Therefore, the true technical protection scope of the invention should be defined by the appended claims.

INDUSTRIAL APPLICABILITY

Embodiments relate to a pre-mold substrate having high reliability and a method of manufacturing the pre-mold substrate.

The invention claimed is:

1. A method of manufacturing a pre-mold substrate, the method comprising:
preparing an electrically conductive substrate;
forming a groove on one surface of the substrate;
arranging a resin to cover the one surface of the substrate and the groove;
removing a portion of the resin so that at least a portion of the one surface of the substrate protrudes higher than a surface of the resin covering the groove forming a mounting end, wherein the resin arranged in the groove is disposed so as to structurally form a portion of the pre-mold substrate with the mounting ends exposed; and
forming a circuit pattern on another surface of the substrate;
wherein the forming of the circuit pattern comprises arranging a photosensitive resist on the another surface of the substrate, exposing and developing a pattern mask corresponding to the circuit pattern facing the another surface of the substrate, and removing a portion of the another surface of the substrate by applying an etchant to the another surface of the substrate, and
wherein the forming of the circuit pattern further comprises forming a protective layer covering the one surface of the substrate, before applying the etchant to the another surface of the substrate, and removing the protective layer after applying the etchant to the another surface of the substrate.

2. The method of claim 1, wherein the forming of the groove comprises removing a portion of the one surface of the substrate.

3. The method of claim 1, wherein the forming of the groove comprises removing a portion of the one surface of the substrate by a half-etching method.

4. The method of claim 3, wherein the forming of the groove comprises arranging a photosensitive resist on the one surface of the substrate, exposing and developing a groove pattern mask corresponding to the groove to face the one surface of the substrate, and removing a portion of the one surface of the substrate by applying an etchant to the one surface of the substrate.

5. The method of claim 1, wherein a thickness of a portion of the substrate, the portion of the substrate being a portion in which the groove is formed by the forming of the groove, is 35 μm or more.

6. The method of claim 1, further comprising a surface treatment operation of roughening the one surface of the substrate, between the forming of the groove and the arranging of the resin.

7. The method of claim 1, further comprising curing the resin, between the arranging of the resin and the removing of a portion of the resin.

8. The method of claim 1, wherein, in the arranging of the resin, the resin is arranged to cover the entire area of the one surface of the substrate and the groove.

9. The method of claim 8, wherein the removing of a portion of the resin comprises first removing the resin so that the one surface of the substrate is exposed, and secondly removing a portion of the resin within the groove, after the one surface of the substrate is exposed.

10. The method of claim 1, wherein, in the removing of a portion of the resin, the resin is removed using a laser beam or a polishing brush.

11. The method of claim 1, wherein a height at which at least a portion of the one surface of the substrate protrudes higher than a surface of the resin by the removing of a portion of the resin is 0.01 mm to 0.03 mm.

12. The method of claim 1, further comprising forming a plating layer on at least one surface of the one surface of the substrate and the circuit pattern on the another surface of the substrate.

13. The method of claim 1, wherein the circuit pattern comprises: a mounting portion on which a semiconductor chip is mountable; and a land located outside the mounting portion and electrically connected to the semiconductor chip by wire.

* * * * *